United States Patent [19]
Kay

[11] Patent Number: 5,938,782
[45] Date of Patent: *Aug. 17, 1999

[54] SCAN FLIP-FLOP AND METHODS FOR CONTROLLING THE ENTRY OF DATA THEREIN

[75] Inventor: Douglas Kay, Los Gatos, Calif.

[73] Assignee: VLSI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/719,149

[22] Filed: Sep. 24, 1996

[51] Int. Cl.$^6$ .................................................. G01R 31/28
[52] U.S. Cl. .......................................... 714/726; 365/201
[58] Field of Search .............................. 371/22.31, 22.32, 371/22.34, 22.36, 22.5, 27.5; 395/183.06; 307/272.2, 465; 327/202, 210–212; 324/765; 365/201

[56] References Cited

U.S. PATENT DOCUMENTS

| | | | |
|---|---|---|---|
| 5,003,204 | 3/1991 | Cushing et al. | 307/465 |
| 5,130,568 | 7/1992 | Miler et al. | 307/272.2 |
| 5,458,736 | 10/1995 | Nakamura | 371/22.3 |
| 5,519,714 | 5/1996 | Nakamura et al. | 371/22.3 |
| 5,596,584 | 1/1997 | Warren | 371/22.3 |
| 5,646,567 | 7/1997 | Felix | 327/202 |

OTHER PUBLICATIONS

Digital Systems Testing and Testable Design by Abramovici, Breuer and Friedman, pp. 343–346, 358–361 and 370–371 (1990).

Principles of CMOS VLSI Design: A System Perspective by Weste and Eshraghian, pp. 485–492 (1993).

Passport CB60SY240–0.6 Micron, 5 Volt Optimum Silicon Library by Compass Design Automation, pp. 243–244, 270–271 (1996).

Scan Tools—Scan Design User Guide V8R4.2 by Compass Design Automation, pp. 3–2—3–4 (1993).

*Primary Examiner*—Robert W. Beausoliel, Jr.
*Assistant Examiner*—Nadeem Iqbal
*Attorney, Agent, or Firm*—Wells, St. John, Roberts, Gregory & Matkin P.S.

[57] ABSTRACT

A scan data flip-flop having improved timing characteristics is provided. A scan flip-flop includes: a first data input coupled with a first latch; a second data input coupled with said first latch; a clock input coupled with said first latch; a data control input; and a data controller operably coupled with said clock input and said data control input and said first latch; said data controller being configured to generate an enable signal responsive to a clock signal from said clock input and a data control signal from said data control input, and said enable signal to control the input of data into said first latch. The normal or first data input signal is preferably directly applied to the first latch within the scan data flip-flop according to the present invention. The data controller of the scan data flip-flop according to the present invention is preferably void of a multiplexer. A method for controlling the entry of data into a scan data flip-flop is also provided.

38 Claims, 6 Drawing Sheets

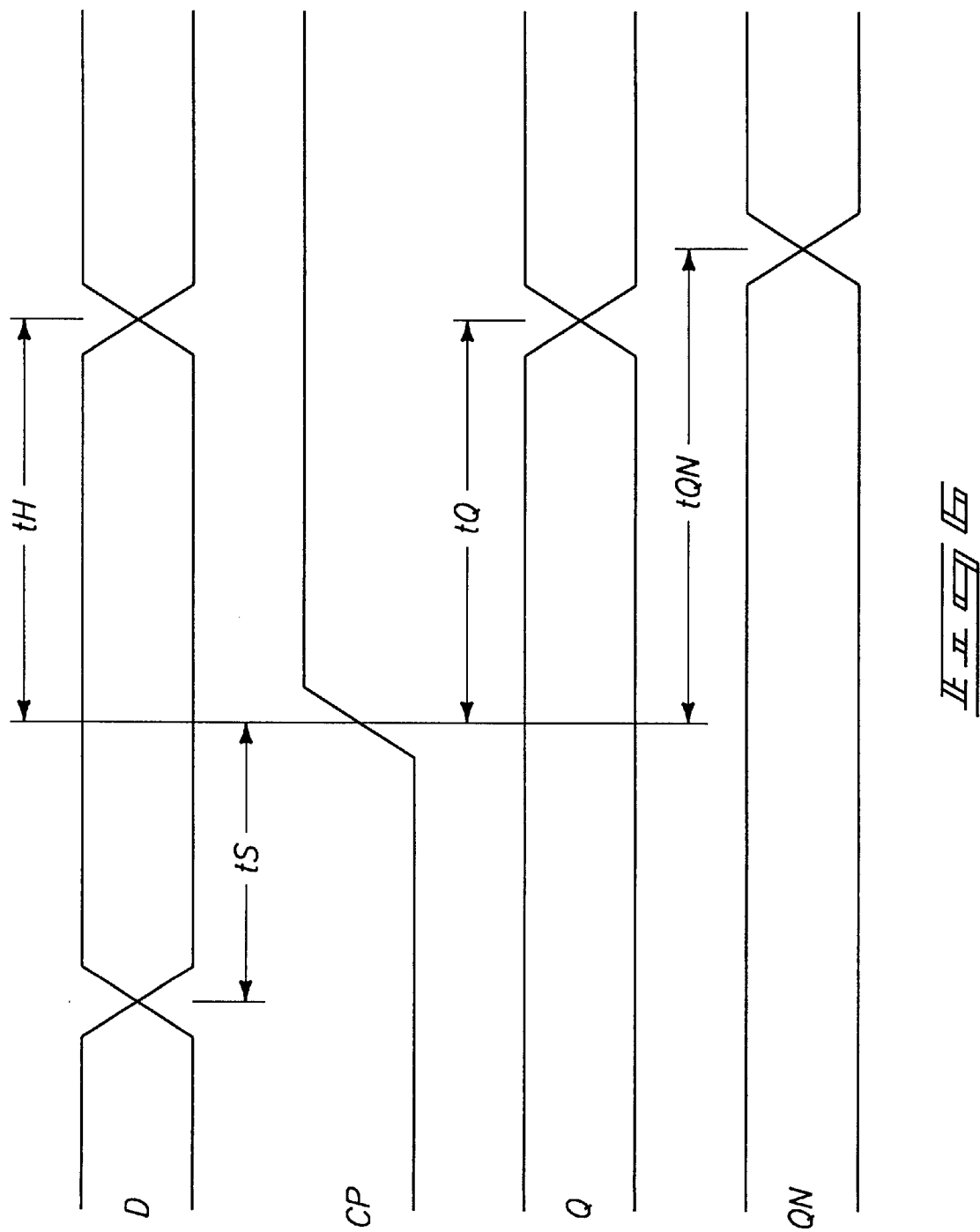

5,938,782

1
SCAN FLIP-FLOP AND METHODS FOR CONTROLLING THE ENTRY OF DATA THEREIN

TECHNICAL FIELD

The present invention relates to flip-flops, and more particularly to scan flip-flops and methods for controlling the entry of data into the scan flip-flops.

BACKGROUND OF THE INVENTION

Testability of an electrical circuit is a design characteristic that generally allows for the status (normal, inoperable, degraded) of a device to be determined and the isolation of faults within the device to be performed quickly to reduce both the test time and cost. Design for testability techniques are design efforts employed to ensure that a device is testable.

One of two attributes related to testability is controllability which is the ability to establish a specific signal value at each node in a circuit by setting values on the circuit's inputs. The other attribute is observability which is the ability to determine the signal value at any node in a circuit by controlling the circuit's inputs and observing its outputs.

The observability and controllability of an electrical circuit may usually be enhanced through the utilization of test points. Additionally, a scan register having both shift and parallel-load capability can be utilized to enhance observability and/or controllability.

The storage cells within the scan register are usually used as observation points and/or control points. A scan register may include a plurality of multiplexed scan data flip flops to form a plurality of storage cells.

A logic chip 10 having combinational logic 8 and sequential logic 9 is shown in FIG. 1. Combinational logic 8 is coupled with a plurality of parallel inputs 11 and a plurality of parallel outputs 12. The sequential logic 9 may comprise a plurality of storage cells 20 as shown in FIG. 1. A clock 7 produces a clock signal which synchronizes the storage cells. The storage cells 20 may include classical (normal) data flip-flops.

Referring to FIG. 2, a prior art data flip-flop 30 is shown. The data flip-flop 30 includes a single data input 32, clock signal input 33, first data output 34 and an inverted data output 35. The classical data flip flop 30 includes a first latch 36 and second latch 37 for storing data.

A plurality of signals 14, 15, 16 are applied from the combinational logic 8 to the sequential logic 9 as shown in FIG. 1. The signals 14, 15, 16 are difficult to observe because they drive D inputs of the respective data flip-flop storage cells 20 and the signals can only be observed at the parallel outputs 12. A plurality of signals 17, 18, 19 are applied from the sequential logic 9 to the combinational logic 8. The signals 17, 18, 19 are difficult to control because they are driven by data flip-flop storage cells 20 and only the parallel inputs 11 can be directly controlled.

The utilization of multiplexed scan data flip-flops was introduced in the prior art to enhance observability and controllability. FIG. 3 shows a block diagram of a logic chip 10a coupled with a plurality of parallel inputs 11 and a plurality of parallel outputs 12. Like numerals from the first described embodiment are utilized where appropriate with any significant difference being indicated with the suffix "a" or with different numerals. A scan register 13 having a plurality of storage cells 20a including scan data flip-flops is shown coupled with the combinational logic 8. The scan flip-flop storage cells 20a may be utilized to observe signals 14, 15, 16 and control signals 17, 18, 19.

Scan data flip-flop storage cells 20a may be loaded with data from two data sources. During a normal mode of operation, data signals from the combinational logic 8 may be loaded via signals 14–16 into respective data inputs (each generally referred to as "D"). During a scan mode of operation, data may be loaded into the first scan data flip-flop storage cell 20a from the scan data input 22 via a scan data input port (generally referred to as "SD"). During a data shift operation, the output data of the first scan data flip-flop storage cell 20a may be loaded into the next scan data flip-flop storage cell 20a at the next clock cycle.

A scan mode control 21 provides a scan control signal to a scan control input (generally referred to as "SC" or a data control input) of each scan data flip-flop storage cell 20a for selecting the mode of operation of the scan data flip-flop storage cells 20. Usually the data control signal from scan mode control 21 is a logic low signal during the normal mode of operation and logic high signal during the scan mode of operation.

A scan register 13 may load data in parallel during the normal mode of operation and shift data during the scan mode of operation. Loading data into the scan register 13 during a scan mode of operation is generally referred to as a scan-in operation and reading data out of the scan register is generally referred to as a scan-out operation. Responsive to a scan mode of operation being selected, the output of each scan data flip-flop storage cell 20a in the scan path becomes a pseudo input to the combinational logic 8 thereby improving controllability. The input of each scan data flip-flop storage cell 20a within the scan path becomes a pseudo output of the combinational logic 8 thereby improving the observability of the logic chip 10.

More specifically, the scan data flip-flop storage cells 20 may input data via signals 14–16 when the scan register 13 is utilized to observe the data within the combinational logic 8. The scan mode control 21 operates the inputting of data via signals 14–16. Subsequently, the data inputted via signals 14–16 may be scanned out of the scan register 13 into a scan data output 23 responsive to a scan out data control signal from scan mode control 21. Thereafter, the data may be analyzed to observe the operation of the combinational logic 8 of the logic chip 10.

The scan mode control 21 also operates the inputting of data into the logic chip 10 for controlling signals 17–19. More specifically, data available at scan data input 22 may be read into the scan flip-flops 20 within the scan register 13 responsive to a data control signal from scan mode control 21. Thereafter, the scan-in data may be inputted into the combinational logic 8 via signals 17–19 thereby improving the controllability of the logic chip 10.

A conventional multiplexed scan data flip-flop 40 which has been utilized to comprise each of the storage cells 20 within a scan register 13 is shown in FIG. 4. The multiplexed scan data flip flop 40 includes a clock input 42 for providing synchronized operation.

The multiplexed scan data flip-flop 40 additionally includes a first data input 43 and a second data input 44. The first data input 43 (also referred to as normal data input) and second data input 44 (also referred to as a scan data input) are coupled with an internal multiplexer 46 within the multiplexed scan data flip-flop 40. The multiplexer 46 is coupled with a first latch 47 within the multiplexed scan data flip-flop 40. A scan control 45 operates the internal multiplexer 46 for controlling the application of data signals via one of the first data input 43 and second data input 44 to the first latch 47. More specifically, a data signal is introduced into the first latch 47 via the first input 43 during a normal mode of operation and the second input 44 during a scan mode of operation.

However, the utilization of multiplexed scan flip-flops have introduced performance drawbacks which include variations of setup and hold times and susceptibility to clock skew within the scan chain. The clock skew problem may be alleviated somewhat by providing additional delays within the scan chain. However, the setup time and hold time variations are caused by delays through the internal multiplexers within the multiplexed scan flip-flops and such variations present a critical problem.

A conventional approach to solve the setup time and hold time variations has included the utilization of an unbalanced multiplexer by providing large devices in the normal data path. However, this solution still has an inherent performance degradation and requires additional space for implementing the unbalanced multiplexer.

Therefore, a need exists for providing a scan flip-flop which provides reduced or minimized timing performance degradation within the normal data path.

BRIEF DESCRIPTION OF THE DRAWINGS

Preferred embodiments of the invention are described with reference to the following drawings.

FIG. 6 is a diagrammatic representation of a timing diagram of a data flip-flop.

DETAILED DESCRIPTION OF THE PREFERRED EMBODIMENTS

Figure 1:
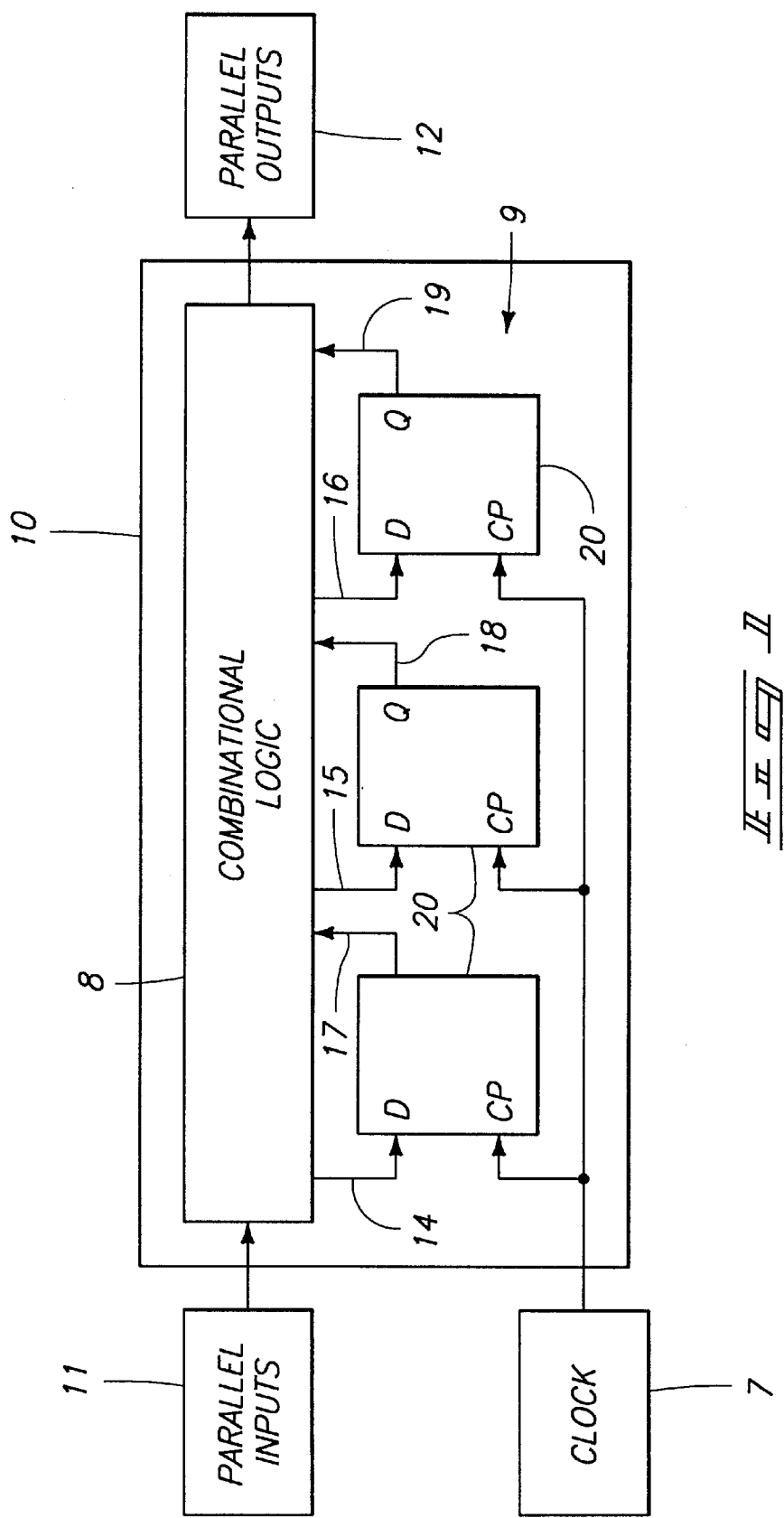
FIG. 1 is a block diagram of a prior art logic chip having combinational logic and sequential logic including a plurality of classical data flip-flops.

This disclosure of the invention is submitted in furtherance of the constitutional purposes of the U.S. Patent Laws "to promote the progress of science and useful arts" (Article 1, Section 8).

Although the present invention is generally described with reference to data (D type) flip-flops, it is to be distinctly understood that the invention is not limited thereto. The present invention may be utilized within other latches and flip-flops including, but not limited to, set-reset (S-R) type flip-flops, J-K type flip-flops, and T type flip-flops.

In accordance with one aspect of the invention, a scan flip-flop comprises:
 a first data input coupled with a first latch;
 a second data input coupled with said first latch;
 a clock input coupled with said first latch;
 a data control input; and
 a data controller operably coupled with said clock input and said data control input and said first latch, said data controller being configured to generate an enable signal responsive to a clock signal from said clock input and a data control signal from said data control input, said enable signal controlling the input of data into said first latch.

In accordance with another aspect of the present invention, a scan flip-flop comprises:
 a first latch;
 a first data input configured to receive a first data signal;
 a data interconnect intermediate said first data input and said first latch to transfer said first data signal therebetween;
 a second data input coupled with said first latch to apply a second data signal thereto;
 a clock input coupled with said first latch to apply a clock signal thereto;
 a data controller coupled with said first latch to selectively apply one of said first data signal and said second data signal thereto; and
 a data control input coupled with said data controller.

According to another aspect of the present invention, a scan flip-flop comprises:
 a first data input coupled with a first latch and said first data input being operable to receive a first data signal;
 a second data input coupled with said first latch and said second data input being operable to receive a second data signal;
 a clock input coupled with said first latch to apply a clock signal thereto,
 a data controller configured to control an application of one of said first data signal and said second data signal to said first latch, said data controller being void of a multiplexer; and
 a data control input coupled with said data controller.

In accordance with still another aspect of the present invention, a method for controlling the entry of data into a first latch within a scan flip-flop comprises the steps of:
 providing a first data input and a data control input and a clock input;
 providing a data control signal via the data control input;
 providing a clock signal via the clock input; and
 generating an enable signal to control the input of a first data signal via the first data input into a first latch.

These and other aspects of the invention will be more readily appreciated from the following description with reference to the accompanying drawings.

Figure 5:
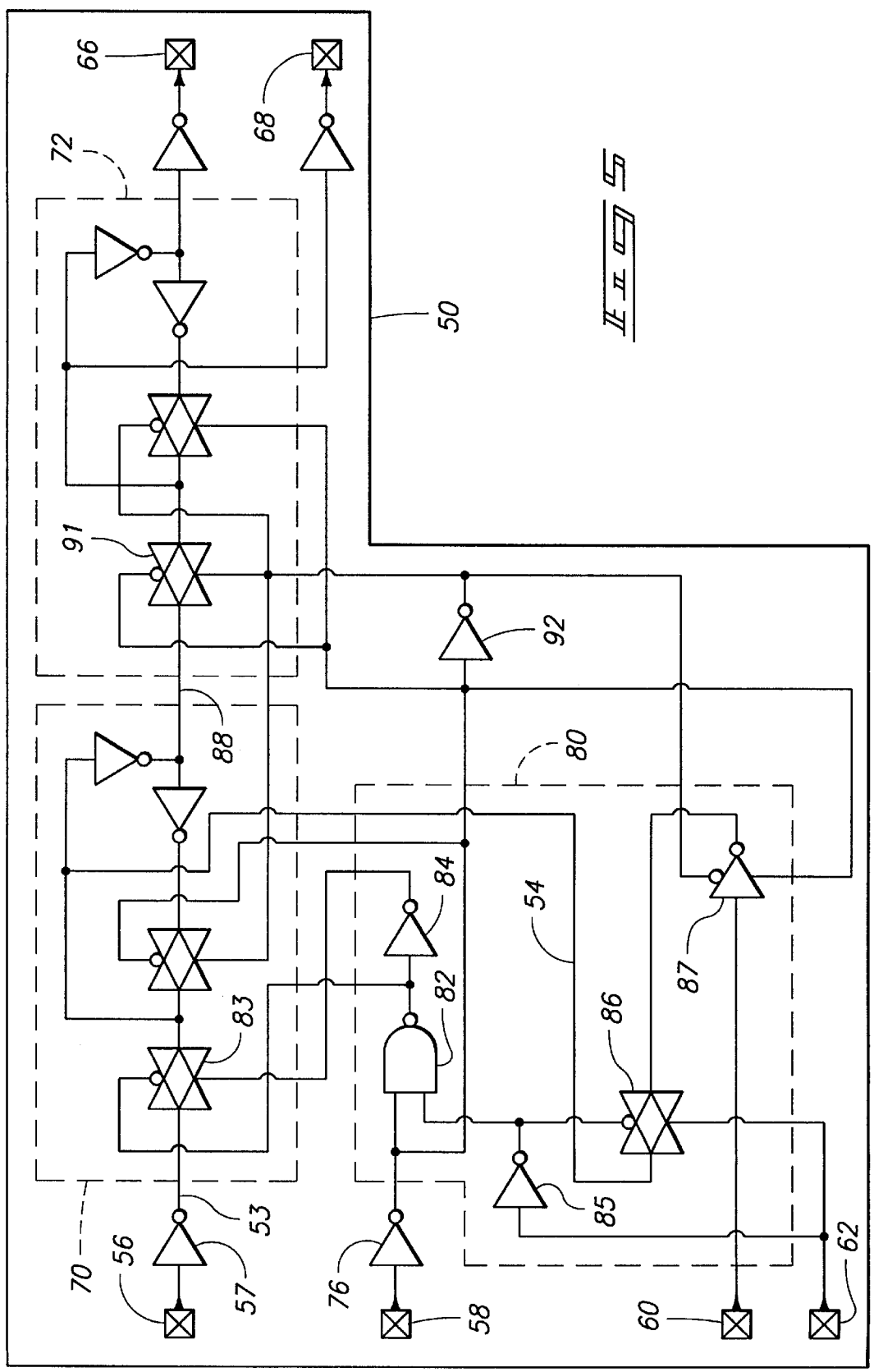
FIG. 5 is a block diagram of a scan data flip-flop in accordance with the present invention.

A preferred embodiment of a scan data flip-flop 50 in accordance with the present invention is shown in FIG. 5 The scan data flip-flop (scan D flip-flop) 50 includes a first data input 56 which is commonly referred to as a D input. The scan data flip-flop 50 also includes a second data input 60 for providing scan functions. Second data input 60 may be referred to as a SD input or scan data input.

The first data input 56 is connected to the normal data path and applies a first data signal received thereby to a first latch 70 within the scan data flip-flop 50. The second data input 60 is connected to a scan data path and applies a second data signal received thereby to the first latch 70 within the scan data flip-flop 50.

The scan data flip-flop 50 includes a second latch 72 which is coupled with the first latch 70. Two outputs 66, 68 are coupled with the second latch 72. The first (commonly referred to as Q) output 66 outputs data inputted via first data input 56 or second data input 60. The second output 68 (commonly referred to as QN) provides an output signal which is the inverse of the data signal at the first output 66.

A clock input 58 is provided within the scan data flip-flop 50 and the clock input 58 is configured to receive a clock signal for synchronization.

The inputting of data into the scan data flip-flop 50 via first data input 56 or second data input 60 is controlled by a data controller 80. For example, the scan data flip-flop 50 is configured to accept data via the first data input 56 in response to the data controller 80 providing a logic low enable signal (preferably 0 volts). Additionally, the scan data flip-flop 50 receives scan data via the second data input 60 responsive to the data controller 80 providing a logic high enable signal (preferably 3.3v–5v). Data controller 80 generates either a logic low enable signal or logic high enable signal for controlling the input of data into the scan data flip-flop 50 responsive to a data control signal. Further, the data controller 80 controls the input of data into the scan data flip-flop 50 in synchronization with an input clock signal received via the clock input 58.

The preferred embodiment of the scan data flip-flop 50 shown in FIG. 5 is configured as a master-slave or pulse-triggered scan data flip-flop having the first latch 70 and the second latch 72. However, flip-flops with two data inputs of other configurations, such as an edge-triggered scan data flip-flops having a single latch, are also within the scope of the present invention. Providing a scan data flip-flop having a master-slave configuration is preferred to provide predictable operation and eliminate a race condition common in single latch scan data flip-flops.

The first latch 70 is coupled with the first data input 56 and the second data input 60 via respective first data interconnect 53 and second data interconnect 54. An input buffer 57 is coupled with the first data input 56 for buffering the input data signal received thereon.

The second latch 72 is coupled with the first latch 70 via node interconnect 88. Input data stored within the first latch 70 is transferred to the second latch 72 via node interconnect 88 in synchronization with the clock signal received via clock input 58. The second latch 72 is coupled with the first output 66 and the second output 68. The second latch 72 provides a data signal stored therein to the first output 66 and second output 68.

The clock input 58 is preferably coupled with the first latch 70 and second latch 72. The clock input 58 applies a clock signal received thereby to the first latch 70 and second latch 72 for providing synchronous data flow within the scan data flip-flop 50. The scan data flip-flop 50 also includes a data control input 62 for receiving a data control signal.

The input clock signal and input data control signal may be utilized to control the data inputted into the first latch 70 of the scan data flip-flop 50. A first data signal present at the first input 56 is inputted into the first latch 70 responsive to a logic high data control signal being present at the data control input 62. Conversely, a scan or second data signal present at the second data input 60 is input into the first latch 70 responsive to a logic low data control signal being present at the data control input 62.

More specifically, the clock input 58 and data control input 62 are coupled with the data controller 80 which controls the input of data into the scan data flip-flop 50 responsive to the clock signal and data control signal. Still referring to FIG. 5, the clock signal is received via clock input 58 and preferably applied to a clock buffer 76. The buffered clock signal is inputted into a first logic gate 82 within the data controller 80. The first logic gate 82 is also electrically connected with the data control input 62 to receive the input data control signal therefrom.

The scan data controller 80 generates enable signals from the input clock signal and input data control signal. The enable signals control the input of data via first data input 56 and second data input 60 into the scan data flip-flop 50. In particular, the first logic gate 82 is preferably a logic NAND gate which generates a logic low enable signal responsive to a logic low data control signal being received via data control input 62. The generation of a logic low enable signal by the first logic gate 82 is synchronized with the clock signal received via the clock input 58. An inverter 84 is coupled with the first logic gate 82. The enable signal generated by the first logic gate 82 may be applied to the inverter 84, thereby providing two signals for operating an electronic switch, such as a forward or latch transmission gate 83 within the first latch 70 for controlling the input of a first data signal via the first data input 56.

Responsive to a logic low data control signal received via data control input 62, latch transmission gate 83 permits the entry of a first data signal into the first latch 70 synchronized with the clock signal received via clock input 58. In other words, latch transmission gate 83 passes the first data signal received via first data input 56 when the clock signal received via clock input 58 is a logic low thereby providing synchronous operation.

The scan data flip-flop according to the present invention is further configured to receive a second data control signal. The data controller 80 preferably includes a scan data transmission gate 86 for controlling the input of a scan or second data signal received via the second data input 60. Responsive to a logic high signal present on data control input 62, scan data transmission gate 86 is enabled and passes the second data signal into the first latch 70 via second data interconnect 54, and the scan data flip-flop 50 operates in a scan mode.

In particular, a data control signal received via data control input 62 is applied to an inverter 85 for providing two data control signals for controlling the operation of the scan data transmission gate 86. A logic high data control signal is inverted within inverter 85 and both the logic high and logic low data control signals are applied to the scan data transmission gate 86. The data control signals enable the scan data transmission gate 86 and permit the second data signal to enter into the first latch 70.

A second logic gate 87 is provided intermediate the second data input 60 and the scan data transmission gate 86 for synchronizing the input second data signal with the clock signal. The second logic gate 87 is preferably a three-state logic gate or full transmission gate. Second logic gate 87 may pass the second data signal received via second data input 60 when the clock signal received via the clock input 58 is a logic low thereby providing synchronous operation.

The input clock signal received via the clock input 58 is applied to an inverter 92. The input clock signal and inverted clock signal enable the second logic gate 87. Second logic gate 87 passes the second data signal received via the second data input 60 to scan data transmission gate 86 which selectively applies the second data signal to the first latch 70 when the scan data flip-flop 50 is operating in a scan mode.

Regardless of operation in a normal data mode or scan data mode, new data is selectively entered into the first latch 70 via one of first data input 56 or second data input 60 when the input clock signal is logic low. The data is present at node interconnect 88 after entry into the first latch 70. The data may thereafter be read into the second latch 72 for providing an output data signal via first output 66 and second output 68.

Providing a scan data flip-flop 50 having a preferred pulse triggered or master/slave configuration enables the data present at node interconnect 88 to be read into second latch 72 when the state of the clock changes. The second latch 72 within the scan data flip-flop 50 shown in FIG. 5 receives the data at node interconnect 88 when the input clock signal received via clock input 58 becomes a logic high signal. The data is thereafter available at the first output 66 and the inverse of the data is available at the second output 68.

More specifically, a data transmission gate 91 controls the entry of data at node interconnect 88 into the second latch 72. An inverter 92 is utilized to provide an inverted clock signal. The buffered clock signal may be inverted by the inverter 92 to provide two control signals for operating transmission gate 91 as shown in FIG. 5. The transmission gate 91 preferably passes data present at node interconnect 88 responsive to the clock signal at clock input 58 changing to a logic high clock signal. Thereafter, the data within second latch 72 is present at the first data output 66 and second data output 68. Other configurations or schemes for providing synchronization may be utilized and are within the scope of the present invention.

Figure 2:
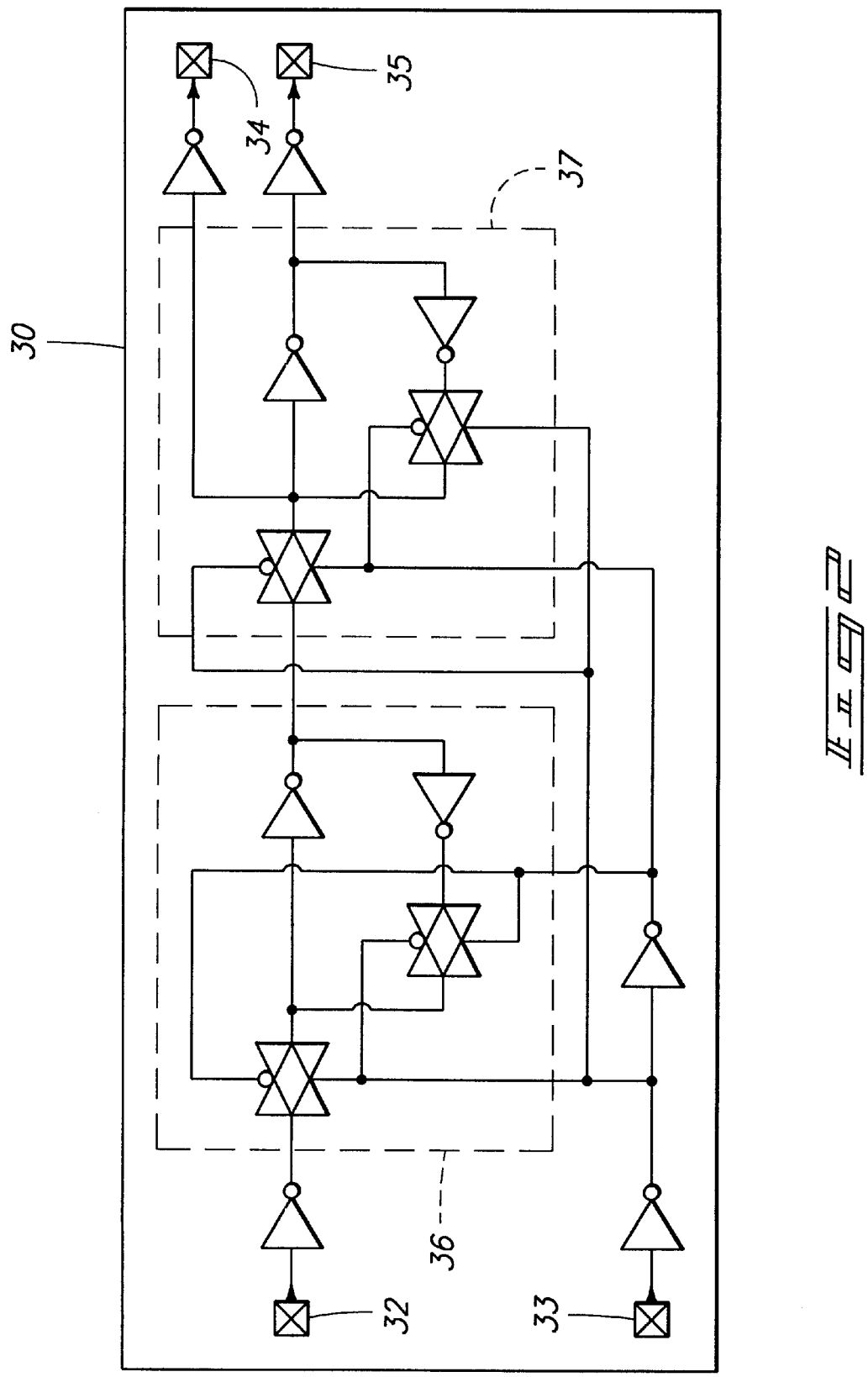
FIG. 2 is a block diagram of a conventional master/slave data flip flop.
Figure 3:
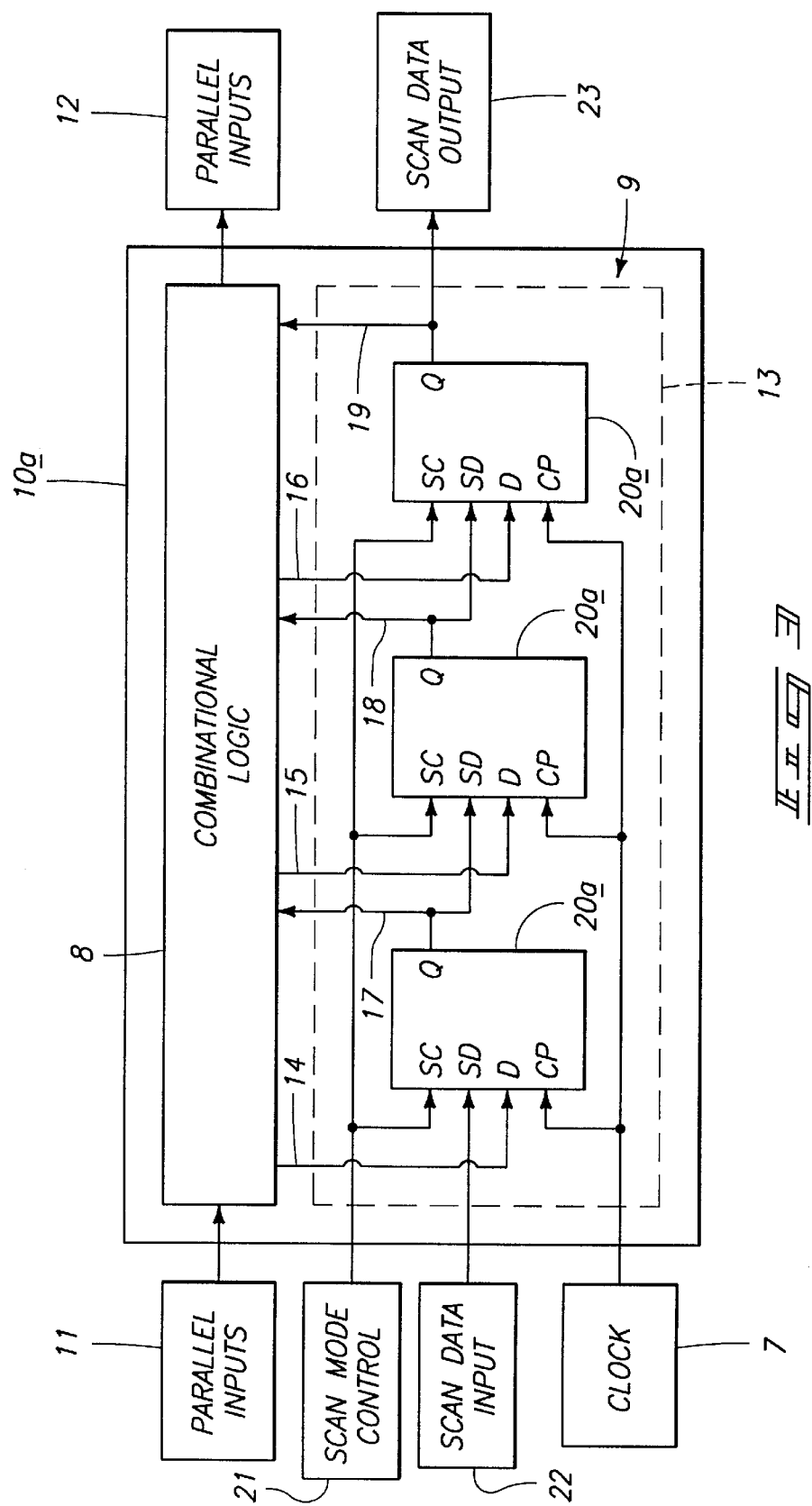
FIG. 3 is a block diagram of a prior art logic chip having combinational logic and sequential logic including a plurality of scan data flip-flops.
Figure 4:
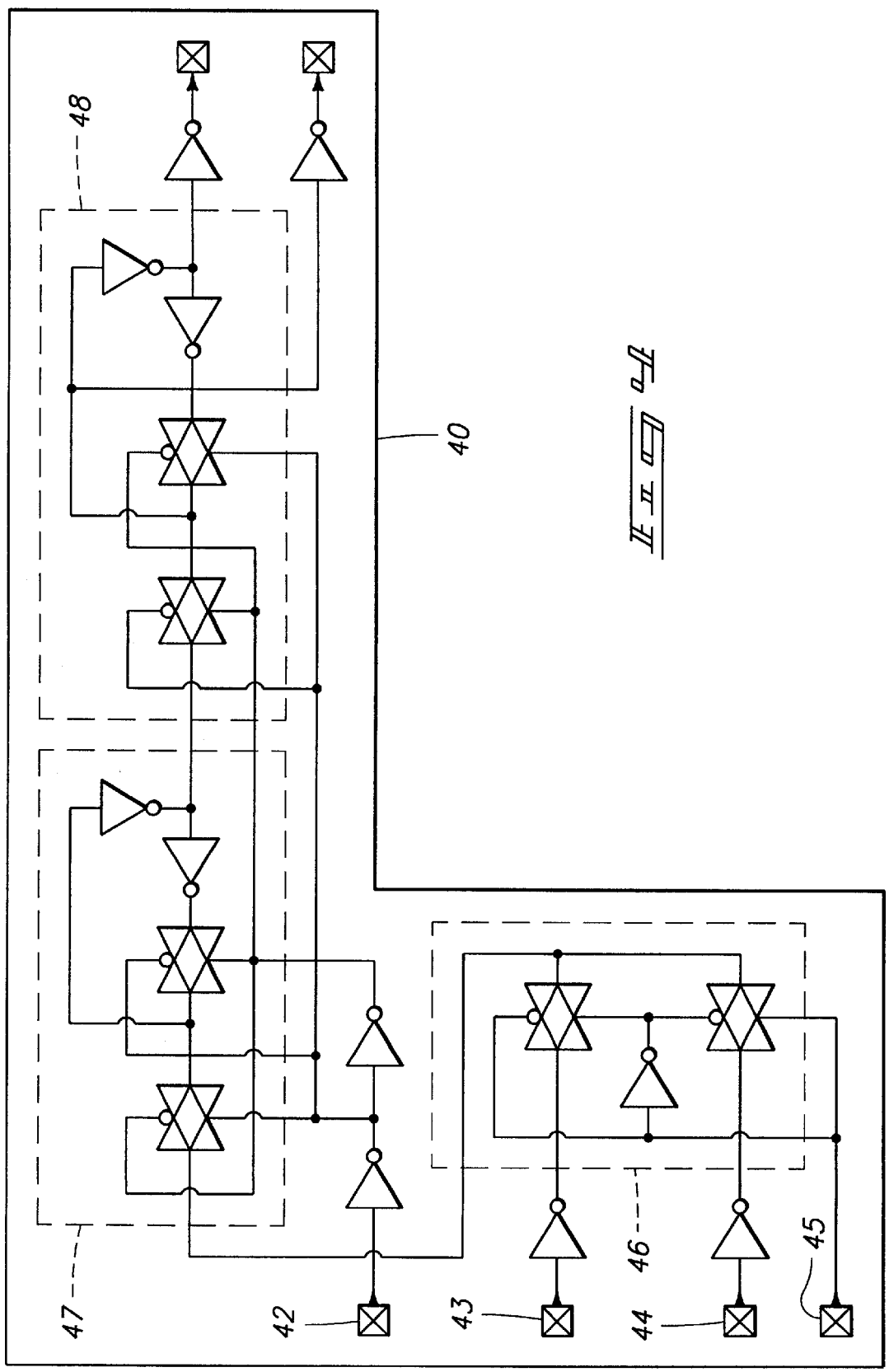
FIG. 4 is a block diagram of a conventional multiplexed scan data flip-flop.

Table 1 below shows relevant timing statistics of the conventional data flip-flop 30 shown in FIG. 2, the conventional multiplexed scan data flip-flop 40 shown in FIG. 4, and the scan data flip-flop 50 according to the present invention shown in FIG. 5.

TABLE 1

|  | $t_{setup}$ | $t_{hold}$ | $t_Q$ | $t_{QN}$ |
| --- | --- | --- | --- | --- |
| Data Flip-Flop 30 | 0.146 | <0 | 0.356 + 2.003*c | 0.296 + 2.000*c |
|  |  |  | 0.388 + 1.514*c | 0.305 + 1.514*c |
| Mux Scan Data | 0.240 | <0 | 0.359 + 2.00*c | 0.295 + 2.00*c |
| Flip-Flop 40 |  |  | 0.389 + 1.51*c | 0.307 + 1.51*c |
| Scan Data Flip- | 0.146 | <0 | 0.352 + 2.00*c | 0.284 + 2.00*c |
| Flop 50 |  |  | 0.379 + 1.51*c | 0.302 + 1.51*c |

As shown in timing statistics, the scan data flip-flop 50 according to the present invention has improved timing performance compared with the conventional multiplexed scan data flip-flop. The hold time is usually less than zero and for modelling purposes was set to zero for each analysis. As shown in Table 1, the scan data flip-flop 50 according to the present invention achieved the same setup time as the classical data flip-flop 30.

Referring to FIG. 6, the timing performance in tQ and tQN of the scan data flip-flop 50 according to the present invention is comparable with the timing performance of the conventional multiplexed scan data flip-flop 40. The times tQ (CP to Q) and tQN (CP to QN) for both scan data flip-flops 40, 50 are variable and are dependent upon the capacitance at the output of the flip-flop. The results shown in Table 1 indicate that the scan data flip-flop 50 in accordance with the present invention will not introduce additional delay when compared with the timing performance (both tQ and tQN) of a conventional multiplexed scan flip-flop 40.

The setup time and hold time of the scan data flip flop 50 in accordance with the present invention are determined by the time delay between the data input 56 and the interconnect node 88 and the timing of the control signals for the latch transmission gate 83 and data transmission gate 91. The logic NAND gate 82 and the inverter 84 delay the enable signal which operates the latch transmission gate 83. It is favorable to minimize the delay through the logic NAND gate 82 and the inverter 84. In particular, the delay is preferably minimized during the state where the output of the logic NAND gate 82 goes high and the output of the inverter 84 goes low. The size of the logic NAND gate 82 and the inverter 84 may be adjusted to reduce the delay therethrough.

In addition, the size of the latch transmission gate 83 may be adjusted to compensate for the delay through the logic NAND gate 82 and the inverter 84. The sizing of the logic NAND gate 82, latch transmission gate 83 and inverter 84 are subject to variation dependent upon the process technology utilized to fabricate the scan data flip flop 50 according to the present invention.

The scan data flip-flop 50 in accordance with the present invention provides improved performance by providing a data controller 80 which controls the input of data via the first data input 56 and second data input 60 without a multiplexer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A scan flip-flop, comprising:
   a first data input coupled with a first latch;
   a second data input coupled with said first latch;
   a clock input coupled with said first latch;
   a data control input; and
   a data controller operably coupled with said clock input, said data control input, said second data input, and said first latch, said data controller being configured to generate an enable signal responsive to a clock signal from said clock input and a data control signal from said data control input, and said enable signal controlling the input of a first data signal via said first data input into said first latch, said data controller being further configured to receive a second data signal from said second data input and selectively pass said second data signal from said second data input to said first latch responsive to said data control signal.

2. The scan flip-flop according to claim 1 wherein said data controller includes a first logic gate coupled with said clock input and said data control input, and said first logic gate being configured to generate said enable signal.

3. The scan flip-flop according to claim 1 wherein said data controller includes a NAND gate coupled with said clock input and said data control input, and said NAND gate being configured to generate said enable signal.

4. The scan flip-flop according to claim 1 wherein said data controller applies said enable signal to a latch transmission gate within said first latch to control the input of said first data signal.

5. The scan flip-flop according to claim 1 wherein said data controller includes a scan data transmission gate intermediate said second data input and said first latch, and said scan data transmission gate being operable to selectively apply said second data signal to said first latch.

6. The scan flip-flop according to claim 1 wherein said data controller includes a scan data transmission gate intermediate said second data input and said first latch, and said scan data transmission gate being operable to selectively apply said second data signal to said first latch responsive to said data control signal.

7. The scan flip-flop according to claim 1 wherein said data controller includes:
   a scan data transmission gate intermediate said second data input and said first latch, and said scan data transmission gate being operable to selectively apply said second data signal to said first latch;
   a second logic gate intermediate said second data input and said scan data transmission gate, and said second logic gate being operable to synchronize said second data signal.

8. The scan flip-flop according to claim 1 wherein said first latch applies data to a second latch, and said second latch being operable to apply said first data signal and said second data signal to at least one data output.

9. The scan flip-flop according to claim 1 wherein said first data input is directly coupled with said first latch.

10. The scan flip-flop according to claim 9 further comprising a buffer operable to directly couple said first data input and said first latch and transfer data therebetween.

11. A scan flip-flop, comprising:
    a first data input coupled with a first latch and said first data input being operable to receive a first data signal;
    a second data input coupled with said first latch and said second data input being operable to receive a second data signal;
    a clock input coupled with said first latch to apply a clock signal thereto;
    a data controller configured to control an application of said first data signal to said first latch, said data controller being void of a multiplexer; and
    a data control input coupled with said data controller.

12. The scan flip-flop according to claim 11 wherein said data controller is configured to generate an enable signal responsive to a clock signal from said clock input and a data control signal from said data control input, and said enable signal to control the input of first data signal into said first latch.

13. The scan flip-flop according to claim 11 wherein said data controller includes a logic gate configured to generate an enable signal responsive to a clock signal from said clock input and a data control signal from said data control input, and said enable signal to control the input of said first data signal into said first latch.

14. The scan flip-flop according to claim 11 wherein said data controller is configured to generate an enable signal responsive to a clock signal from said clock input and a data control signal from said data control input, and said data controller applies said enable signal to a latch transmission gate within said first latch to control the input of said first data signal.

15. The scan flip-flop according to claim 11 wherein said data controller includes a scan data transmission gate intermediate said second data input and said first latch, and said scan data transmission gate being operable to selectively apply a second data signal to said first latch.

16. The scan flip-flop according to claim 11 wherein said data controller includes:
    a scan data transmission gate intermediate said second data input and said first latch, and said scan data transmission gate being operable to selectively apply a second data signal to said first latch; and
    a logic gate intermediate said scan data transmission gate and said first latch, and said logic gate being operable to synchronize said second data signal.

17. The scan flip-flop according to claim 11 further comprising:
    a second latch coupled with said first latch, and said second latch being operable to receive said first data signal and said second data signal therefrom; and
    at least one output coupled with said second latch, and said at least one output being operable to receive said first data signal and said second data signal therefrom.

18. The scan flip-flop according to claim 11 further comprising a data interconnect operable to couple said first data input and said first latch and transfer data therebetween.

19. The scan flip-flop according to claim 11 further comprising a data interconnect operable to directly couple said first data input and said first latch and transfer data therebetween.

20. A method for controlling the entry of data into a scan flip-flop having a first data input and a second data input, the method comprising:
    providing a first data input, a second data input, a data control input and a clock input;
    providing a data control signal via said data control input;
    providing a clock signal via said clock input; and
    generating an enable signal using a data controller and responsive to said data control signal and said clock signal;
    controlling the input of a first data signal via said first data input into a first latch using said enable signal;
    receiving a second data signal via said second data input into said data controller; and
    selectively applying said second data signal into said first latch using said data controller and responsive to said data control signal.

21. The method according to claim 20 further comprising the steps of:
    receiving said first data signal via said first data input; and
    applying said first data signal to said first latch from said first data input.

22. The method according to claim 20 further comprising the steps of:
    receiving said first data signal via said first data input;
    applying said first data signal to a buffer from said first data input; and
    applying said first data signal to said first latch from said buffer.

23. The method according to claim 20 wherein said data controller includes a logic gate configured to generate said enable signal responsive to said data control signal and said clock signal.

24. The method according to claim 20 wherein a data interconnect couples said first data input and said first latch, and said data interconnect is operable to transfer said first data signal therebetween.

25. The method according to claim 20 further comprising synchronizing said second data signal with said clock signal using said data controller.

26. The method according to claim 25 wherein a scan data transmission gate controls the input of said second data signal into said first latch responsive to said data control signal.

27. A scan data flip-flop, comprising:
    a first latch;
    a first data input to receive a first data signal;
    a buffer coupled directly with said first data input and said first latch to directly transfer said first data signal from said first data input to said first latch;

a second data input to receive a second data signal;

a data controller coupled with said first latch and said second data input, the data controller being configured to receive said second data signal from said second data input and control the application of said first data signal and said second data signal to said first latch;

a data control input coupled with said data controller to apply a data control signal thereto;

a second latch coupled with said first latch, and said second latch being operable to receive said first data signal and said second data signal therefrom;

a clock input coupled with said first latch and said second latch to apply a clock signal thereto;

at least one output coupled with said second latch, and said at least one output being operable to receive said first data signal and said second data signal therefrom; and said data controller being configured to generate an enable signal responsive to said clock signal and said data control signal, and said data controller applies said enable signal to said first latch to control the input of said first data signal to said first latch, said data controller being further configured to control the input of said second data signal into said first latch responsive to said data control signal, and said data controller being void of a multiplexer.

28. The method according to claim 20 further comprising:

receiving said first data signal using said first data input; and directly applying said first data signal to said first latch from said first data input.

29. The method according to claim 28 wherein said receiving said first data signal comprises receiving and buffering said first data signal.

30. The scan flip-flop according to claim 1 wherein the data controller is void of a multiplexer.

31. The scan flip-flop according to claim 11 wherein the first data input comprises a D input.

32. A scan flip-flop, comprising:

a first data input coupled with a first latch and said first data input being operable to receive a first data signal;

a second data input coupled with said first latch and said second data input being operable to receive a second data signal;

a clock input coupled with said first latch to apply a clock signal thereto;

a data controller configured to control an application of one of said first data signal and said second data signal to said first latch, said data controller being void of a multiplexer;

a data control input coupled with said data controller; and a data interconnect operable to couple said first data input and said first latch and transfer data therebetween.

33. The scan flip-flop according to claim 32 wherein said data controller includes a logic gate configured to generate an enable signal responsive to a clock signal from said clock input and a data control signal from said data control input, and said enable signal to control the input of said first data signal into said first latch.

34. The scan flip-flop according to claim 32 wherein said data controller is configured to generate an enable signal responsive to a clock signal from said clock input and a data control signal from said data control input, and said data controller applies said enable signal to a latch transmission gate within said first latch to control the input of said first data signal.

35. The scan flip-flop according to claim 32 wherein said data controller includes a scan data transmission gate intermediate said second data input and said first latch, and said scan data transmission gate being operable to selectively apply a second data signal to said first latch.

36. The scan flip-flop according to claim 32 wherein said data controller includes:

a scan data transmission gate intermediate said second data input and said first latch, and said scan data transmission gate being operable to selectively apply a second data signal to said first latch; and a logic gate intermediate said scan data transmission gate and said first latch, and said logic gate being operable to synchronize said second data signal.

37. The scan flip-flop according to claim 32 further comprising:

a second latch coupled with said first latch, and said second latch being operable to receive said first data signal and said second data signal therefrom; and at least one output coupled with said second latch, and said at least one output being operable to receive said first data signal and said second data signal therefrom.

38. The scan flip-flop according to claim 32 wherein said data interconnect is operable to directly couple said first data input and said first latch.

* * * * *